United States Patent
Banno

(10) Patent No.: US 10,756,098 B2
(45) Date of Patent: Aug. 25, 2020

(54) SEMICONDUCTOR DEVICE AND MANUFACTURING METHOD OF SEMICONDUCTOR DEVICE

(71) Applicant: DENSO CORPORATION, Kariya, Aichi-pref. (JP)

(72) Inventor: Eisuke Banno, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/437,097

(22) Filed: Jun. 11, 2019

(65) Prior Publication Data

US 2019/0296029 A1    Sep. 26, 2019

Related U.S. Application Data

(63) Continuation of application No. PCT/JP2017/043182, filed on Nov. 30, 2017.

(30) Foreign Application Priority Data

Dec. 26, 2016    (JP) .................... 2016-251693

(51) Int. Cl.
| | | |
|---|---|---|
| H01L 21/00 | (2006.01) |
| H01L 27/11517 | (2017.01) |
| H01L 21/28 | (2006.01) |
| H01L 21/02 | (2006.01) |
| H01L 29/423 | (2006.01) |
| H01L 29/66 | (2006.01) |
| H01L 29/788 | (2006.01) |
| H01L 27/115 | (2017.01) |
| H01L 21/316 | (2006.01) |
| H01L 27/11521 | (2017.01) |

(Continued)

(52) U.S. Cl.
CPC .... *H01L 27/11517* (2013.01); *H01L 21/0217* (2013.01); *H01L 21/02274* (2013.01); *H01L 21/316* (2013.01); *H01L 21/318* (2013.01); *H01L 27/115* (2013.01); *H01L 27/11521* (2013.01); *H01L 29/40114* (2019.08); *H01L 29/42324* (2013.01); *H01L 29/66825* (2013.01); *H01L 29/788* (2013.01); *H01L 29/792* (2013.01)

(58) Field of Classification Search
CPC ......... H01L 27/11517; H01L 27/11521; H01L 21/0217; H01L 21/02274
See application file for complete search history.

(56) References Cited

U.S. PATENT DOCUMENTS

| | | | |
|---|---|---|---|
| 2008/0290393 A1 | 11/2008 | Kakehata et al. | |
| 2010/0140488 A1* | 6/2010 | Visconti | H04N 5/357 250/370.07 |

(Continued)

FOREIGN PATENT DOCUMENTS

| | | |
|---|---|---|
| JP | 2000-012712 A | 1/2000 |
| JP | 2000-340562 A | 12/2000 |

(Continued)

*Primary Examiner* — Nicholas J Tobergte
(74) *Attorney, Agent, or Firm* — Posz Law Group, PLC

(57) ABSTRACT

In a semiconductor device, an insulating film is disposed between an upper surface of a substrate and a floating gate of a flash memory, a first oxide film is disposed directly above the floating gate, a silicon nitride film is disposed on an upper surface of the first oxide film, and a second oxide film made of silicon oxide film is disposed on an upper surface of the silicon nitride film.

23 Claims, 9 Drawing Sheets

(51) Int. Cl.
*H01L 29/792* (2006.01)
*H01L 21/318* (2006.01)

(56) References Cited

U.S. PATENT DOCUMENTS

2010/0308420 A1 12/2010 Usujima et al.
2011/0227139 A1 9/2011 Kakehata et al.
2012/0074478 A1 3/2012 Sugimachi

FOREIGN PATENT DOCUMENTS

| JP | 2000340562 | A | * | 12/2000 | |
| JP | 2012074466 | A | * | 4/2012 | ............ H01L 28/60 |
| JP | 2015-106572 | A | | 6/2015 | |
| JP | 2015106572 | A | * | 6/2015 | |
| JP | 2015-216174 | A | | 12/2015 | |

\* cited by examiner

SEMICONDUCTOR DEVICE AND MANUFACTURING METHOD OF SEMICONDUCTOR DEVICE

CROSS REFERENCE TO RELATED APPLICATIONS

The present application is a continuation application of International Patent Application No. PCT/JP2017/043182 filed on Nov. 30, 2017, which designated the U.S. and claims the benefit of priority from Japanese Patent Application No. 2016-251693 filed on Dec. 26, 2016. The entire disclosures of all of the above applications are incorporated herein by reference.

TECHNICAL FIELD

The present disclosure relates to a semiconductor device and a manufacturing method of a semiconductor device.

BACKGROUND

Some semiconductor devices include silicon nitride (SiN) films as insulating films or protective films. The silicon nitride films can be formed by plasma chemical vapor deposition (CVD) using $NH_3$ gas, $SiH_4$ gas, and $N_2$ gas as source gases.

SUMMARY

The present disclosure provides a semiconductor device and a manufacturing method of a semiconductor device in which an insulating film is disposed between an upper surface of a substrate and a floating gate of a flash memory, a first oxide film is disposed directly above the floating gate, a silicon nitride film is disposed on an upper surface of the first oxide film, and a second oxide film made of silicon oxide film is disposed on an upper surface of the silicon nitride film.

DETAILED DESCRIPTION

Figure 1:
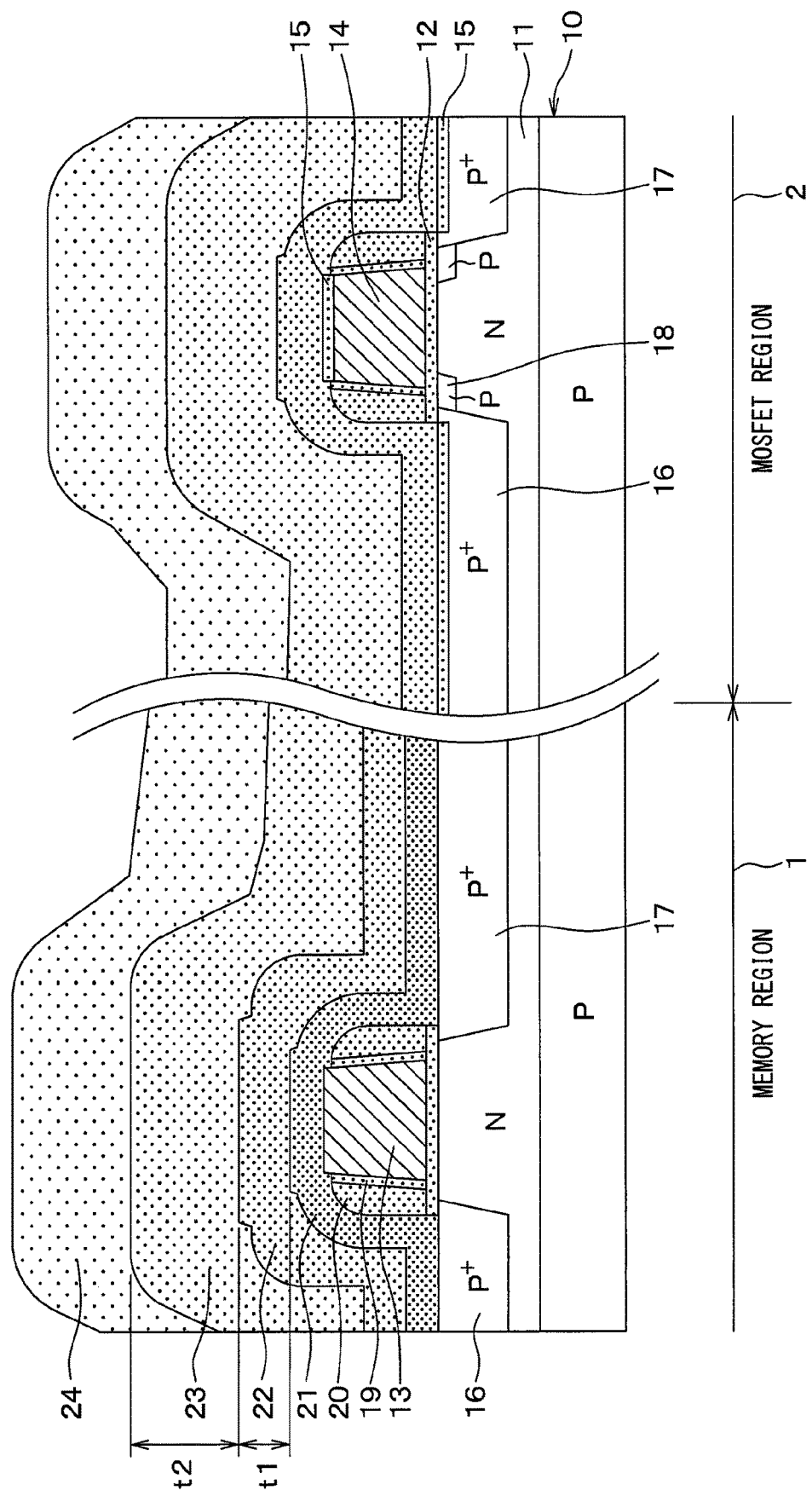
FIG. 1 is a cross-sectional view of a semiconductor device according to a first embodiment.

A SiN film formed by plasma CVD using $SiH_4$ gas and $NH_3$ gas contains a large amount of hydrogen. For example, in an analog MOS circuit, when the SiN film containing hydrogen is formed on an upper portion of a gate as an insulating film, hydrogen in the SiN film diffuses into a layer adjacent to the SiN film, a bias temperature instability (BTI) increases, and an accuracy of the analog MOS circuit is lowered.

On the other hand, a SiN film (hereinafter referred to a SiN film without $NH_3$) formed using $SiH_4$ gas and $N_2$ gas without using $NH_3$ gas as source gases has a lower hydrogen content than the SiN film formed using the $SiH_4$ gas and the $NH_3$ gas. Accordingly, when the SiN film without $NH_3$ is used as an insulating film on an upper portion of a gate in an analog MOS circuit, BTI can be restricted and an accuracy of the analog MOS circuit can be improved.

However, in the SiN film without $NH_3$, trapping sites are formed, for example, due to a film quality of the SiN film without $NH_3$ and a processing damage caused when another insulating film is formed on an upper portion. Thus, in a case where the SiN film without $NH_3$ is applied to a semiconductor device such as a flash memory that stores information by accumulating charges in a floating gate, when the semiconductor device is placed in a high-temperature environment, the charges accumulated in the floating gate are captured by the trap sites, thereby lowering charge retention characteristics.

According to an aspect of the present disclosure, a semiconductor device includes a substrate, a memory region in which a flash memory that stores information by accumulating charges in a floating gate is formed, an insulating film disposed between an upper surface of the substrate and the floating gate, a first oxide film disposed on an upper surface of the floating gate, a silicon nitride film disposed on an upper surface of the first oxide film, a second oxide film disposed on an upper surface of the silicon nitride film, and at least above the floating gate, a film thickness of the second oxide film is equal to or more than a film thickness of the silicon nitride film.

When the film thickness of the second oxide film is set to be equal to or more than the thickness of the silicon nitride film as described above, a processing damage applied to the silicon nitride film when an oxide film or the like is formed over the second oxide film can be reduced, and trap sites can be reduced.

According to another aspect of the present disclosure, a semiconductor device includes a substrate, a memory region in which a flash memory that stores information by accumulating charges in a floating gate is formed, an insulating film disposed between an upper surface of the substrate and the floating gate, an oxide film disposed on an upper surface of the floating gate, and a silicon nitride film disposed on an upper surface of the oxide film, and the silicon nitride film has a refractive index between 1.88 and 1.918 inclusive.

In the silicon nitride film, when a surface adjacent to the floating gate contains a larger amount of Si, since the number of dangling bonds increases, the number of trap sites increases. In this regard, with the adjustment of a gas ratio introduced into an atmosphere at the beginning of film formation of the silicon nitride film, Si and N are contained in the silicon nitride film in a well-balanced manner, so that dangling bonds are reduced and trap sites can be reduced. The refractive index of the silicon nitride film changes depending on the content ratio of Si and N, and trap sites can be reduced by adjusting the gas ratio at the beginning of film formation so that the refractive index becomes between 1.88 and 1.918 inclusive.

According to another aspect of the present disclosure, a manufacturing method of a semiconductor device including a memory region in which a flash memory that stores information by accumulating charges in a floating gate is formed, includes forming an insulating film on an upper surface of a substrate, forming the floating gate on an upper surface of the insulating film, forming a first oxide film on an upper surface of the floating gate, forming a silicon nitride film on an upper surface of the first oxide film using $SiH_4$ gas and $N_2$ gas as raw materials, and forming a second oxide film on an upper surface of the silicon nitride film with a film thickness equal to or more than a film thickness of the silicon nitride film.

When the film thickness of the second oxide film is set to be equal to or more than the thickness of the silicon nitride film as described above, a processing damage applied to the silicon nitride film when the oxide film or the like is formed over the second oxide film can be reduced, and trap sites can be reduced.

According to another aspect of the present disclosure, a manufacturing method of a semiconductor device including a memory region in which a flash memory that stores information by accumulating charges in a floating gate is formed, includes forming an insulating film on an upper surface of a substrate, forming the floating gate on an upper surface of the insulating film, forming a first oxide film on an upper surface of the floating gate, forming a silicon nitride film on an upper surface of the first oxide film using $SiH_4$ gas and $N_2$ gas as raw materials, forming a second oxide film on an upper surface of the silicon nitride film, and forming a third oxide film on an upper surface of the second oxide film at a film formation temperature of 300° C. or less.

When the film forming temperature of the third oxide film is set to 300° C. or lower as described above, a processing damage applied to the silicon nitride film at a time of forming the third oxide film can be reduced, and trap sites can be reduced.

According to another aspect of the present disclosure, a manufacturing method of a semiconductor device including a memory region in which a flash memory that stores information by accumulating charges in a floating gate is formed, includes forming an insulating film on an upper surface of a substrate, forming the floating gate on an upper surface of the insulating film, forming an oxide film on an upper surface of the floating gate, and forming a silicon nitride film on an upper surface of the oxide film using $SiH_4$ gas and $N_2$ gas as raw materials. The forming the silicon nitride film includes adjusting a gas ratio of the $SiH_4$ gas and the $N_2$ gas so that the silicon nitride film has a refractive index between 1.88 and 1.918 inclusive.

In the silicon nitride film, when a surface adjacent to the floating gate contains a larger amount of Si, since the number of dangling bonds increases, the number of trap sites increases. In this regard, with the adjustment of the gas ratio introduced into the atmosphere at the beginning of the film formation of the silicon nitride film, Si and N are contained in the silicon nitride film in a well-balanced manner, so that dangling bonds are reduced and trap sites can be reduced. The refractive index of the silicon nitride film changes depending on the content ratio of Si and N, and trap sites can be reduced by adjusting the gas ratio at the beginning of film formation so that the refractive index becomes between 1.88 and 1.918 inclusive.

According to another aspect of the present disclosure, a manufacturing method of a semiconductor device including a memory region in which a flash memory that stores information by accumulating charges in a floating gate is formed, includes forming an insulating film on an upper surface of a substrate, forming the floating gate on an upper surface of the insulating film, forming an oxide film on an upper surface of the floating gate, and forming a silicon nitride film on an upper surface of the oxide film using an $SiH_4$ gas and an $N_2$ gas as raw materials. The forming the silicon nitride film includes performing plasma igniting after introducing the $SiH_4$ gas and the $N_2$ gas into an atmosphere to form the silicon nitride film by plasma CVD.

When the silicon nitride film is formed, if only the $N_2$ gas is first introduced into the atmosphere to ignite the plasma, the surface of the first oxide film is damaged, the dangling bonds increase, and the number of trap sites increases. In this regard, when plasma ignition is performed after introducing both of the source gases into the atmosphere, the damage applied to the surface of the first oxide film can be reduced, so that dangling bonds can be reduced and trap sites can be reduced.

According to another aspect of the present disclosure, a manufacturing method of a semiconductor device including a memory region in which a flash memory that stores information by accumulating charges in a floating gate is formed, includes forming an insulating film on an upper surface of a substrate, forming the floating gate on an upper surface of the insulating film, forming an oxide film on an upper surface of the floating gate, and forming a silicon nitride film on an upper surface of the oxide film using an $SiH_4$ gas and an $N_2$ gas as raw materials. The forming the silicon oxide film includes setting an amount of the $SiH_4$ gas introduced into an atmosphere at a beginning of film formation between $115/4500$ $cm^3$ and $125/4500$ $cm^3$ inclusive with respect to 1 $cm^3$ of the $N_2$ gas.

In the silicon nitride film, when a surface adjacent to the floating gate contains a larger amount of Si, the number of dangling bonds increases, so that the number of trap sites increases. In this regard, with the above adjustment of the gas ratio introduced into the atmosphere at the beginning of the film formation of the silicon nitride film, Si and N are contained in the silicon nitride film in a well-balanced manner, so that dangling bonds are reduced and trap sites can be reduced.

As described above, in some aspects of the present disclosure, the structure of the film formed on the silicon nitride film or the film forming method can reduce the processing damage applied to the silicon nitride film and can reduce the trap sites. In some other aspects, by the method of forming the silicon nitride film, the dangling bond at an interface with the floating gate can be reduced and the trap sites can be reduced.

Embodiments of the present disclosure will be described below with reference to the drawings. In the following embodiments, the same reference numerals are assigned to parts that are the same or equivalent to each other.

First Embodiment

A first embodiment will be described. As shown in FIG. 1, a semiconductor device according to the present embodiment includes a memory region 1 in which a flash memory that stores information by accumulating charges in a floating gate is formed, and a MOSFET region 2 in which an MOSFET element is formed. The MOSFET region 2 corresponds to an element region.

As shown in FIG. 1, the flash memory and the MOSFET element are formed to a substrate 10. The substrate 10 is a P-type silicon substrate, and an N-type well layer 11 is formed by doping a surface layer portion of the substrate 10 with an N-type impurity. An insulating film 12, which is a silicon oxide film, is formed on a part of an upper surface of the N-type well layer 11.

The insulating film 12 is formed in each of the memory region 1 and the MOSFET region 2. A floating gate 13 is formed on an upper surface of the insulating film 12 in the memory region 1, and a gate electrode 14 is formed on the upper surface of the insulating film 12 in the MOSFET region 2. The floating gate 13 and the gate electrode 14 are made of polysilicon, for example.

In the MOSFET region 2, the gate electrode 14 and a silicide layer 15 for contact connection to a source layer 16 and a drain layer 17 which will be described later are formed on a portion of an upper surface of the gate electrode 14 and an upper surface of the N-type well layer 11 in which the insulating film 12 is not formed.

In the surface layer portion of the N-type well layer 11, a P-type well layer having a higher impurity concentration than an impurity concentration of an electric field relaxation layer 18, which will be described later, is formed on both sides of the floating gate 13. The P-type well layer formed on one side of the floating gate 13 is the source layer 16, and the P-type well layer formed on the other side is the drain layer 17. In the memory region 1, the amount of charges held in the floating gate 13 is adjusted by operating the potentials of the substrate 10, the source layer 16, the drain layer 17, and a control gate (not shown), to thereby store information.

Similarly, P-type well layers are formed on both sides of the gate electrode 14, one P-type well layer is used as the source layer 16, and the other P-type well layer is used as the drain layer 17. In the surface layer of the N-type well layer 11 in the MOSFET region 2, P-type electric field relaxation layers 18 are formed at a portion corresponding to one end portion of the gate electrode 14 adjacent to the source layer 16 and a portion corresponding to the other end portion adjacent to the drain layer 17. The electric field relaxation layers 18 adjacent to the source layer 16 and the drain layer 17 are formed so as to be in contact with the source layer 16 and the drain layer 17, respectively.

Insulating films 19, which are a silicon oxide film, are formed on side wall surfaces of the floating gate 13 and the gate electrode 14. Sidewalls 20 are formed on a surface of the insulating film 19 opposite to the floating gate 13 and on a surface opposite to the gate electrode 14.

In the memory region 1, an oxide film 21 is formed so as to cover the insulating film 12, the floating gate 13, the source layer 16, the drain layer 17, the insulating film 19, and the sidewalls 20. The oxide film 21 is formed of a silicon oxide film and corresponds to a first oxide film.

The SiN film 22 is formed in a region including the memory region 1 and the MOSFET region 2. The SiN film 22 is formed to cover the oxide film 21 in the memory region 1, and is formed to cover the insulating film 12, the silicide layer 15, the insulating film 19, and the sidewalls 20 in the MOSFET region 2.

The SiN film 22 is formed by plasma CVD using $SiH_4$ gas and $N_2$ gas as source gases. Thus, in the present embodiment, the amount of hydrogen contained in the SiN film 22 is reduced as compared with a case in which the SiN film 22 is formed by plasma CVD using $SiH_4$ gas and $NH_3$ gas as source gases.

An oxide film 23 and an oxide film 24 are stacked in a stated order on the SiN film 22. Each of the oxide film 23 and the oxide film 24 is formed of a silicon oxide film, and corresponds to a second oxide film and a third oxide film.

Assuming that the film thickness of the SiN film 22 in the upper portion of the floating gate 13 is t1 and the film thickness of the oxide film 23 is t2, t2≥1.25×t1 is set in the present embodiment. In the present embodiment, a refractive index of the SiN film 22 is set between 1.88 and 1.918 inclusive.

A manufacturing method of a semiconductor device will be described. In this example, a manufacturing method of the memory region 1 of the semiconductor device will be described with reference to FIGS. 2A to 2G, and a manufacturing method of the MOSFET region 2 will not be illustrated.

Figure 2A:
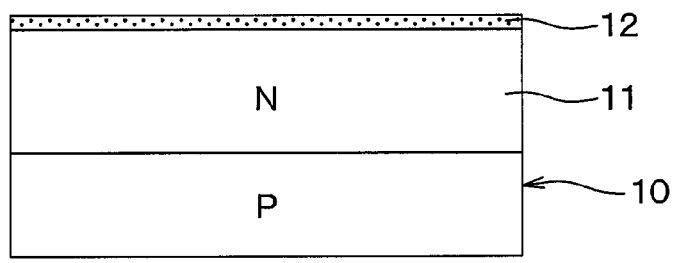
FIG. 2A is a cross-sectional view showing a manufacturing process of the semiconductor device shown in FIG. 1.

In a process shown in FIG. 2A, the substrate 10 that is a P-type silicon substrate is prepared, an N-type impurity is doped into the substrate 10 to form the N-type well layer 11, and then a surface of the substrate 10 is thermally oxidized to form the insulating film 12.

Figure 2B:
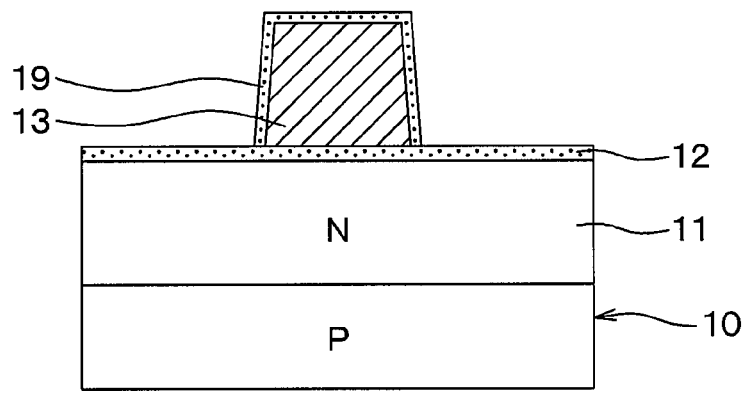
FIG. 2B is a cross-sectional view showing the manufacturing process subsequent to FIG. 2A.

In a process shown in FIG. 2B, after a polysilicon layer has been formed on a surface of the insulating film 12 by CVD, a portion of the polysilicon layer is removed by etching using a mask (not shown) to form the floating gate 13. Then, the surface of the floating gate 13 is thermally oxidized to form the insulating film 19.

Figure 2C:
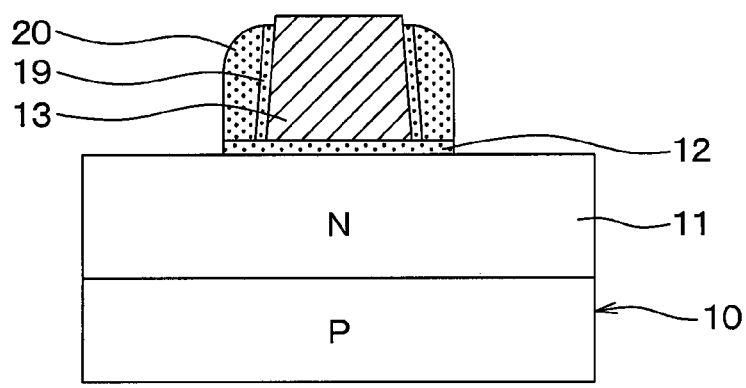
FIG. 2C is a cross-sectional view showing a manufacturing process subsequent to FIG. 2B.

In a process shown in FIG. 2C, a silicon oxide film is formed on the surfaces of the insulating films 12 and 19 by CVD, and then etched back so that the silicon oxide film remains as the sidewalls 20 only on the side walls of the floating gate 13. As a result, the upper surface of the floating gate 13 is exposed. In addition, a part of the insulating film 12 is removed to expose the N-type well layer 11.

Figure 2D:
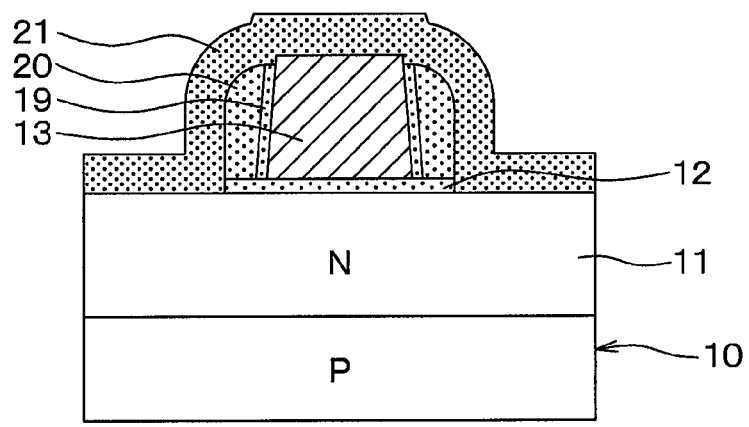
FIG. 2D is a cross-sectional view showing the manufacturing process subsequent to FIG. 2C.
Figure 2E:
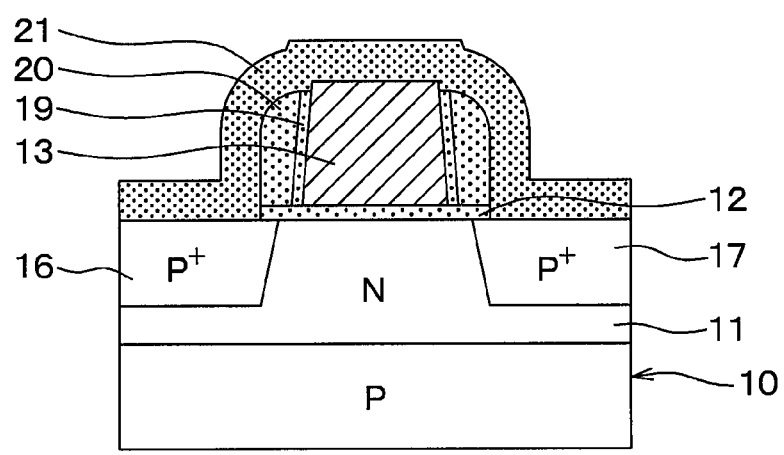
FIG. 2E is a cross-sectional view showing the manufacturing process subsequent to FIG. 2D.

In a process shown in FIG. 2D, the oxide film 21 is formed on the surfaces of the N-type well layer 11, the insulating film 12, the floating gate 13, the insulating film 19, and the sidewalls 20 by CVD. In a process shown in FIG. 2E, the substrate 10 is doped with a P-type impurity to form the source layer 16 and the drain layer 17.

Figure 2F:
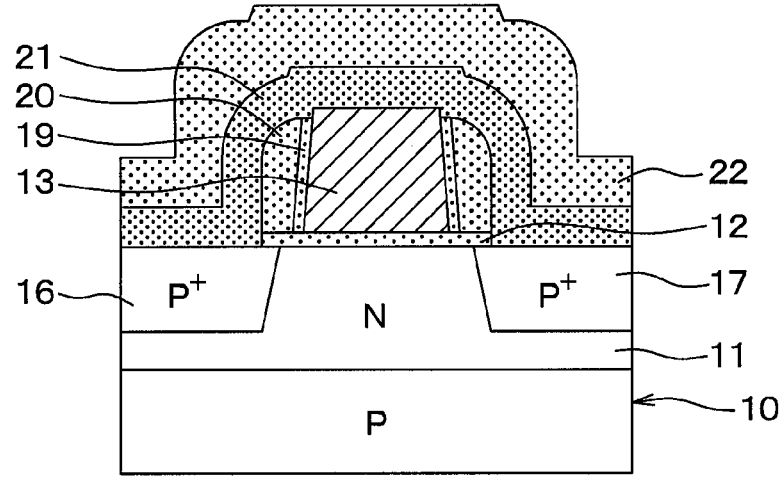
FIG. 2F is a cross-sectional view showing the manufacturing process subsequent to FIG. 2E.

In a process shown in FIG. 2F, the SiN film 22 is formed by plasma CVD using the $SiH_4$ gas and the $N_2$ gas as source gases. At this time, the $SiH_4$ gas and the $N_2$ gas are introduced into the atmosphere and then plasma-ignited. In addition, the gas ratio at the beginning of film formation is set as $SiH_4:N_2=115$ cm$^3$ to 125 cm$^3$:4500 cm$^3$. In other words, the quantity of the $SiH_4$ gas is set between 115/4500 cm$^3$ and 125/4500 cm$^3$ inclusive with respect to 1 cm$^3$ of the $N_2$ gas. The gas ratio is set in this manner to adjust the amount of N contained in the SiN film 22, so that the refractive index of the SiN film 22 becomes between 1.88 and 1.918 inclusive. In the present embodiment, the gas ratio at the beginning of film formation is set to a gas ratio of $SiH_4:N_2=120$ cm$^3$:4500 cm$^3$. In the process shown in FIG.

2F, the SiN film 22 is also formed in the MOSFET region 2 in addition to the memory region 1.

Figure 2G:
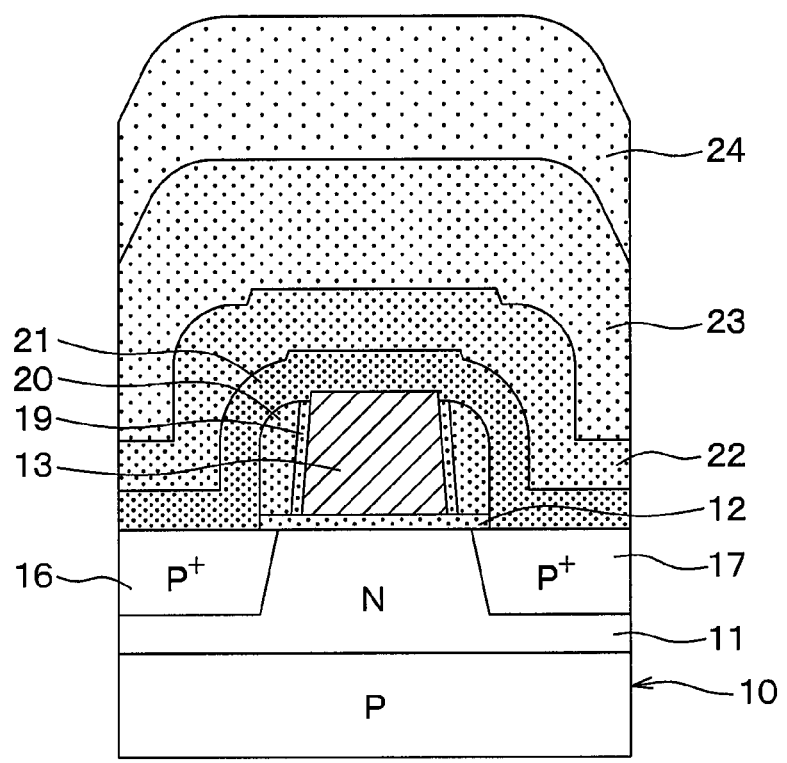
FIG. 2G is a cross-sectional view showing the manufacturing process subsequent to FIG. 2F.

In a process shown in FIG. 2G, the oxide film 23 is formed by CVD so that the film thickness t2 of the oxide film 23 is 1.25 times or more of the film thickness t1 of the SiN film 22. In addition, the oxide film 24 is formed by high-density plasma CVD at a film forming temperature of 300° C. or less.

In this manner, the flash memory is formed in the memory region 1. In such a semiconductor device, data is stored by accumulation of charges in the floating gate 13. Specifically, a potential of the control gate or the like (not shown) is operated, as a result of which electrons transfer to the floating gate 13 to write data, or electrons transfer to the outside of the floating gate 13 to erase data.

Figure 3A:
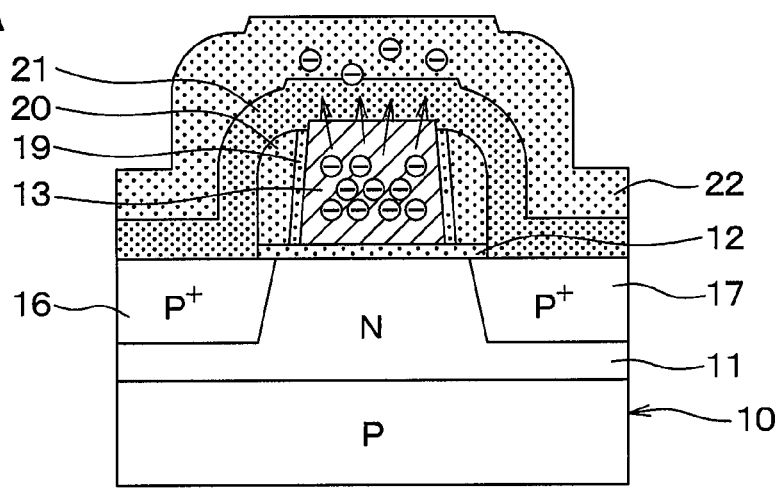
FIG. 3A is a cross-sectional view showing a state in which electrons held in a floating gate transfer to a SiN film through a first oxide film in the semiconductor device including the SiN film in which trap sites are formed.
Figure 3B:
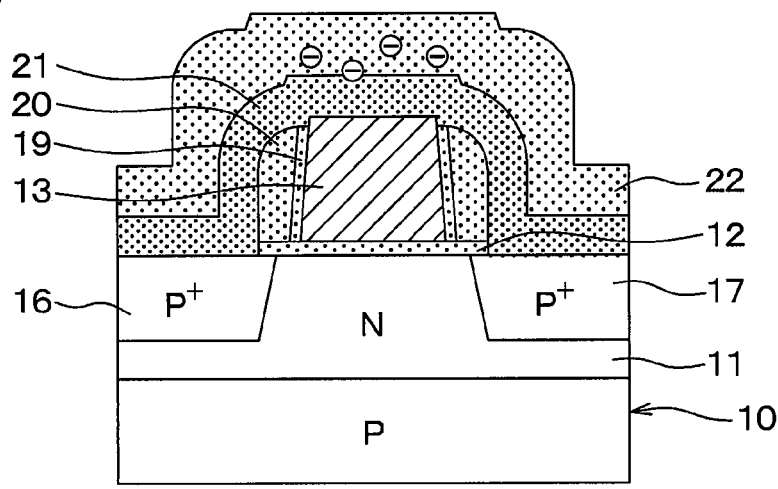
FIG. 3B is a cross-sectional view showing a state in which electrons are held in the SiN film.
Figure 3C:
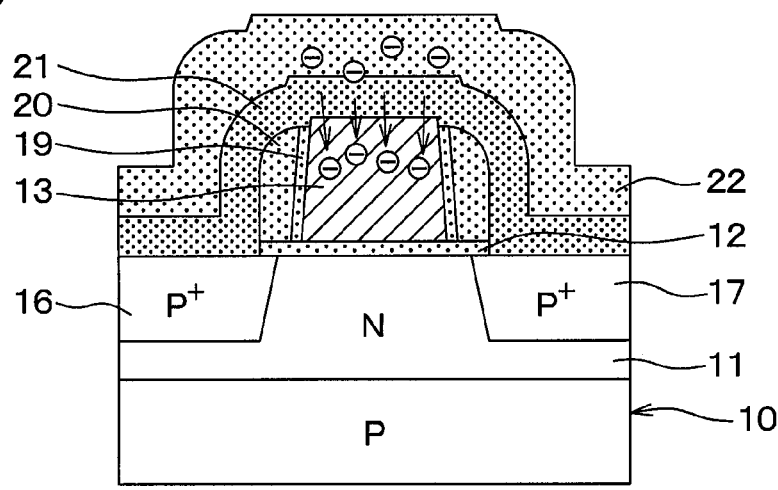
FIG. 3C is a cross-sectional view showing a state in which electrons held in the SiN film transfer to the floating gate through the first oxide film.

When trap sites are formed in the SiN film 22, electrons held in the floating gate 13 transfer to the SiN film 22 through the oxide film 21 as shown in FIG. 3A when the semiconductor device is placed in a high-temperature environment. As shown in FIG. 3B, the electrons that have transferred to the SiN film 22 are held by the SiN film 22 even after the data is erased. Thereafter, when the semiconductor device is placed in a high-temperature environment, the electrons held in the SiN film 22 transfer to the floating gate 13 through the oxide film 21 as shown in FIG. 3C.

When the trap sites are formed in the SiN film 22 in this manner, electrons transfer between the floating gate 13 and the SiN film 22, and the charge retention characteristic of the semiconductor device is deteriorated.

In this regard, the present inventors have investigated a relationship of the method of forming the SiN film 22, the film thickness of the oxide film 23, the method of forming the oxide film 24, the retention failure rate of the semiconductor device, and the like, and have found that the deterioration of the charge retention characteristic can be reduced, for example, by the method of forming the SiN film 22.

Hereinafter, a semiconductor device manufactured by the same method as the present embodiment is referred to as a type product. In other words, in the type product, the film thickness t2 of the oxide film 23 is set to 1.25 times or more of the film thickness t1 of the SiN film 22, and the film forming temperature of the oxide film 24 is set to 300° C. or less. In the type product, the gas ratio at the beginning of forming the SiN film 22 is set to 120 cm$^3$ of the SiH$_4$ gas with respect to 4500 cm$^3$ of the N$_2$ gas with the result that the refractive index of the SiN film 22 is set between 1.88 and 1.918 inclusive. Further, in the type product, when the SiN film 22 is formed, both the source gases are introduced into the atmosphere and then plasma ignited.

Figure 4:
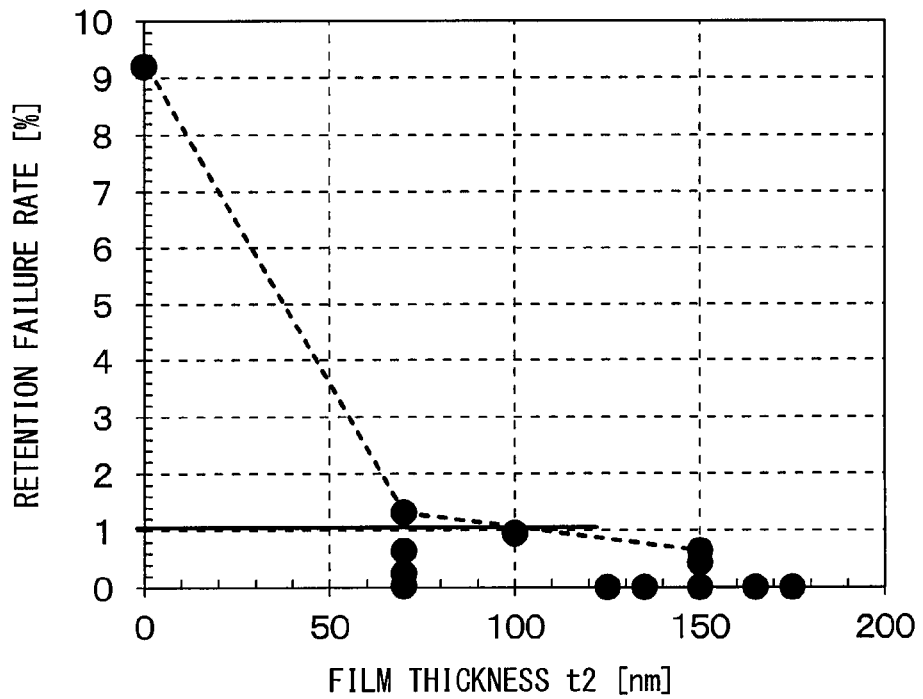
FIG. 4 is a graph showing a relationship between a film thickness of a second oxide film and a retention failure rate.

As shown in FIG. 4, the retention failure rate decreases as the thickness t2 of the oxide film 23 increases, and when the film thickness t2 of the oxide film 23 is equal to or more than the film thickness t1 of the SiN film 22, the retention failure rate becomes equal to or less than 1%. In this example, t1 is set to 100 nm, and a sum of the film thickness t2 of the oxide film 23 and the film thickness of the oxide film 24 is set to 580 nm.

It can be seen from FIG. 4 that the retention failure rate is low especially when t2≥1.25×t1. This is considered to be because the larger the film thickness t2 of the oxide film 23, the easier the processing damage at the time of forming the oxide film 24 is absorbed by the oxide film 23, and the more the processing damage applied to the SiN film 22 is reduced.

If the film thickness t2 of the oxide film 23 is too large, voids may be generated in the vicinity of steps, and therefore, it is preferable to reduce the film thickness t2 of the oxide film 23 to some extent. For example, the film thickness t2 is preferably set to 165 nm or less.

Figure 5:
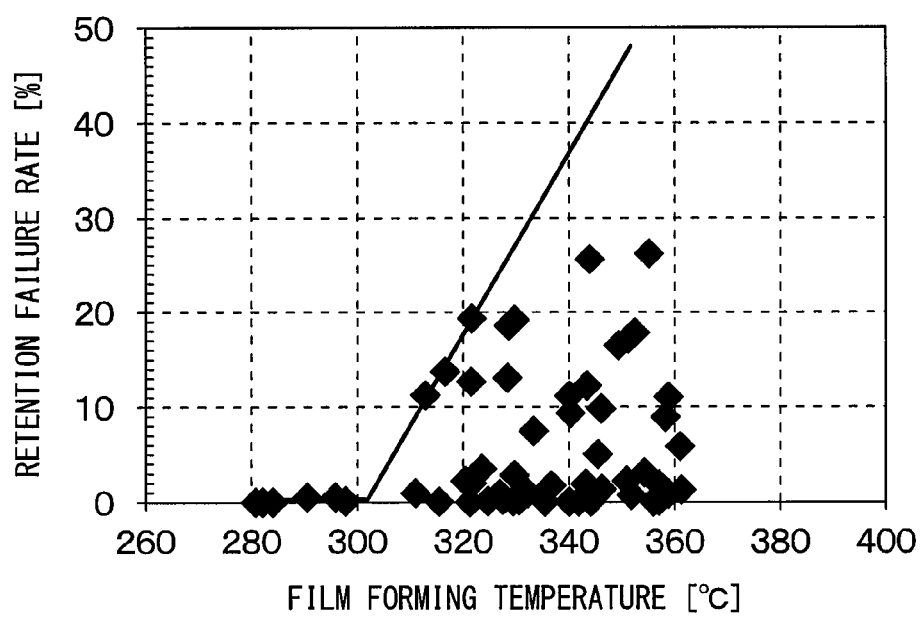
FIG. 5 is a graph showing a relationship between a film forming temperature of a third oxide film and the retention failure rate.

The processing damage at the time of forming the oxide film 24 increases as the film forming temperature of the oxide film 24 increases. Therefore, the film forming temperature of the oxide film 24 is lowered, thereby being capable of reducing the processing damage applied to the SiN film 22 and reducing the deterioration of the charge retention characteristic. More specifically, as shown in FIG. 5, when the film forming temperature of the oxide film 24 is higher than 300° C., the variation of the retention failure rate increases with the increase of the film forming temperature, and the retention failure rate increases. On the other hand, when the film forming temperature of the oxide film 24 is 300° C. or less, the retention failure rate is almost 0.

Figure 6:
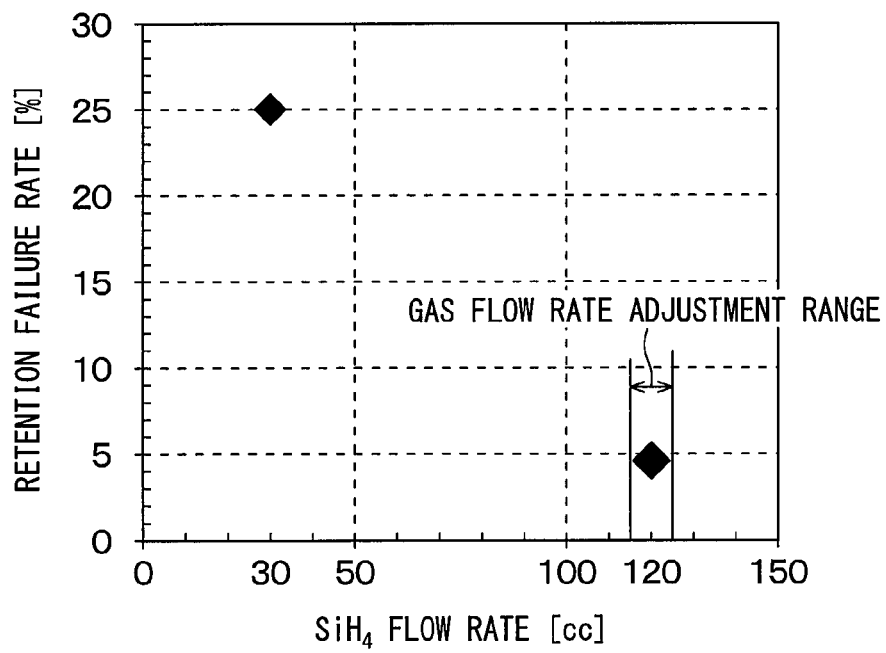
FIG. 6 is a graph showing a relationship between a $SiH_4$ flow rate and a retention failure rate at the beginning of the SiN film formation.

In addition, when the surface of the SiN film 22 adjacent to the oxide film 21 contains a larger amount of Si, the dangling bonds are increased, so that the trap sites in the SiN film 22 are increased and the charge retention characteristics are lowered. In this regard, the gas ratio introduced into the atmosphere at the beginning of the film formation of the SiN film 22 is set to, for example, 120 cm$^3$ of the SiH$_4$ gas with respect to 4500 cm$^3$ of the N$_2$ gas, Si and N are contained in a well-balanced manner on the surface adjacent to the oxide film 21, and dangling bonds are reduced. As a result, as shown in FIG. 6, the retention failure rate can be set to about 5%.

If the amount of the SiH$_4$ gas at the beginning of the film formation is too small, the retention failure rate increases. For example, as shown in FIG. 6, when 30 cm$^3$ of the SiH$_4$ gas is used with respect to 4500 cm$^3$ of the N$_2$ gas, the retention failure rate is about 25%. However, it is considered that even if the amount of the SiH$_4$ gas with respect to 4500 cm$^3$ of the N$_2$ gas is reduced from 120 cm$^3$ by 5 cm$^3$, for example, the retention failure rate can be kept as low as in a case of 120 cm$^3$.

In addition, for example, even if the amount of the SiH$_4$ gas with respect to 4500 cm$^3$ of the N$_2$ gas is increased from 120 cm$^3$ by 5 cm$^3$, it is considered that the retention failure rate can be kept as low as in a case of 120 cm$^3$.

Figure 7:
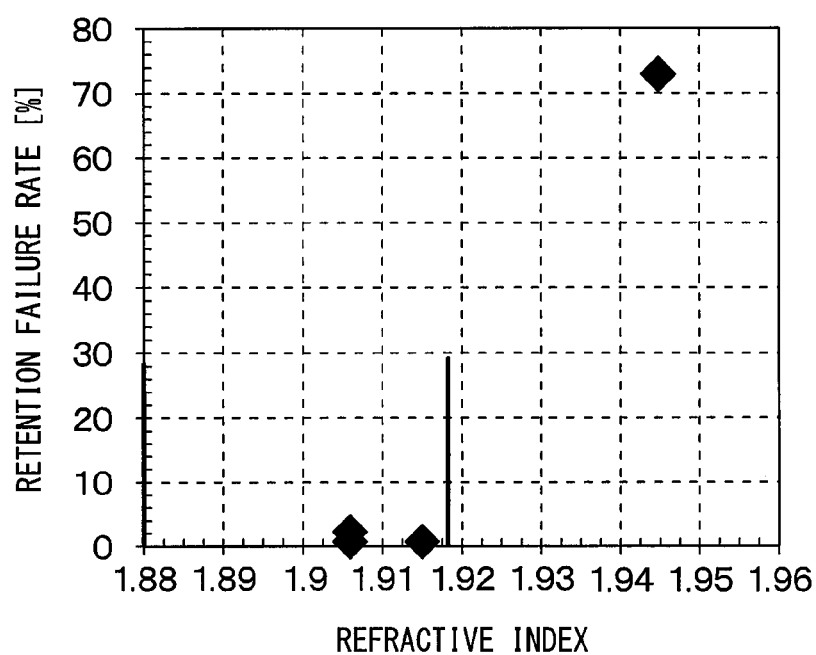
FIG. 7 is a graph showing a relationship between a refractive index of the SiN film and the retention failure rate.

The ratio of Si and N content of the SiN film 22 changes depending on the source gas ratio at the beginning of film formation, as a result of which the refractive index of the SiN film 22 changes. In other words, the charge retention characteristic changes depending on the refractive index of the SiN film 22. FIG. 7 is a graph showing a relationship between the refractive index of the SiN film 22 and the retention failure rate. When the source gas ratio of the SiN film 22 at the beginning of the film formation is set to 115 cm$^3$ to 125 cm$^3$ of the SiH$_4$ gas with respect to 4500 cm$^3$ of the N$_2$ gas, the refractive index of the SiN film 22 is between 1.88 and 1.918 inclusive. As shown in FIG. 7, when the refractive index is between 1.88 and 1.918 inclusive, the retention failure rate is less than 10%.

When the SiN film 22 is formed, if only the N$_2$ gas is first introduced into the atmosphere to ignite the plasma, the surface of the oxide film 21 is damaged, dangling bonds are increased, and trap sites are increased. On the other hand, when plasma ignition is performed after introducing both kinds of source gases into the atmosphere, damage applied to the surface of the oxide film 21 can be reduced, so that dangling bonds can be reduced and trap sites can be reduced.

As described above, in the present embodiment, t2≥1.25×t1 is set and the film forming temperature of the oxide film 24 is 300° C. or less. The gas ratio of the SiN film 22 at the beginning of the film formation is set to 115 to 125 cm$^3$ of the SiH$_4$ gas with respect to 4500 cm$^3$ of the N$_2$ gas, as a result of which the SiN film 22 has a refractive index between 1.88 and 1.918 inclusive. When the SiN film 22 is formed, both the source gases are introduced into the atmosphere and then plasma is ignited. Thus, the trap sites of the SiN film 22 can be reduced, and the deterioration of the charge retention characteristic can be reduced. Accordingly, when an SiN film without $NH_3$ is applied to a semiconductor device in which an analog MOS circuit and the like and a flash memory and the like having a floating gate are formed on the same substrate, the BTI can be reduced while the deterioration in the charge retention characteristic can be reduced.

Figure 8:
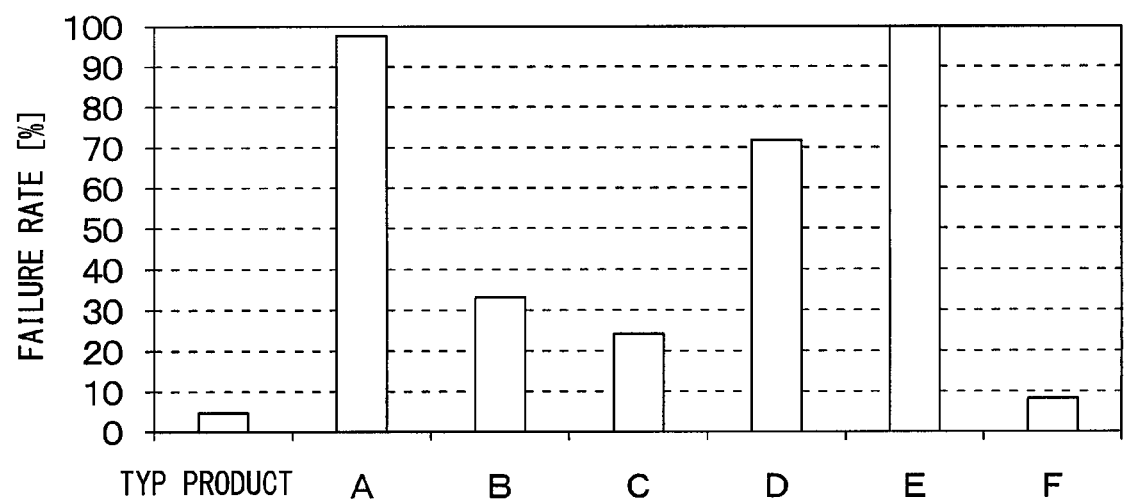
FIG. 8 is a graph showing a relationship between film formation conditions and the failure rate.

It should be noted that it is not necessary to satisfy all of those conditions, and even if only a part of the conditions is satisfied, the failure rate can be improved as shown in FIG. 8.

FIG. 8 shows the failure rates of the type product and semiconductor devices A-F manufactured under different conditions from those of the type product. In the film formation of the SiN film 22 in the semiconductor device A, the $SiH_4$ gas is introduced into the atmosphere before the $N_2$ gas so that the $SiH_4$ gas contained in the atmosphere at the beginning of the film formation is increased. In the film formation of the SiN film 22 in the semiconductor device B, only the $N_2$ gas is first introduced into the atmosphere and is plasma-ignited. In the film formation of the SiN film 22 in the semiconductor device C, the amount of the $SiH_4$ gas at the beginning of the film formation is set to 30 $cm^3$. In the film formation of the SiN film 22 in the semiconductor device D, the amount of the $SiH_4$ gas at the beginning of the film formation is increased so that the refractive index of the SiN film 22 is set to 1.945. The semiconductor device E does not include the SiN film 22. The semiconductor device F does not include the oxide film 23. The semiconductor devices A to F are manufactured in the same manner as the type product except for the above-described differences. A failure rate of a semiconductor device that does not satisfy any of the above-described conditions is almost 100%.

From the graphs of the semiconductor devices B, C, and D in FIG. 8, it can be seen that the failure rate is improved even in the semiconductor devices in which the plasma ignition timing, the gas ratio at the beginning of the film formation, and the refractive index of the SiN film 22 are different from those of the type product.

Second Embodiment

A second embodiment will be described. Since the present embodiment is similar to the first embodiment except that a configuration of a control gate is changed from the first embodiment, only portions different from the first embodiment will be described.

Figure 9:
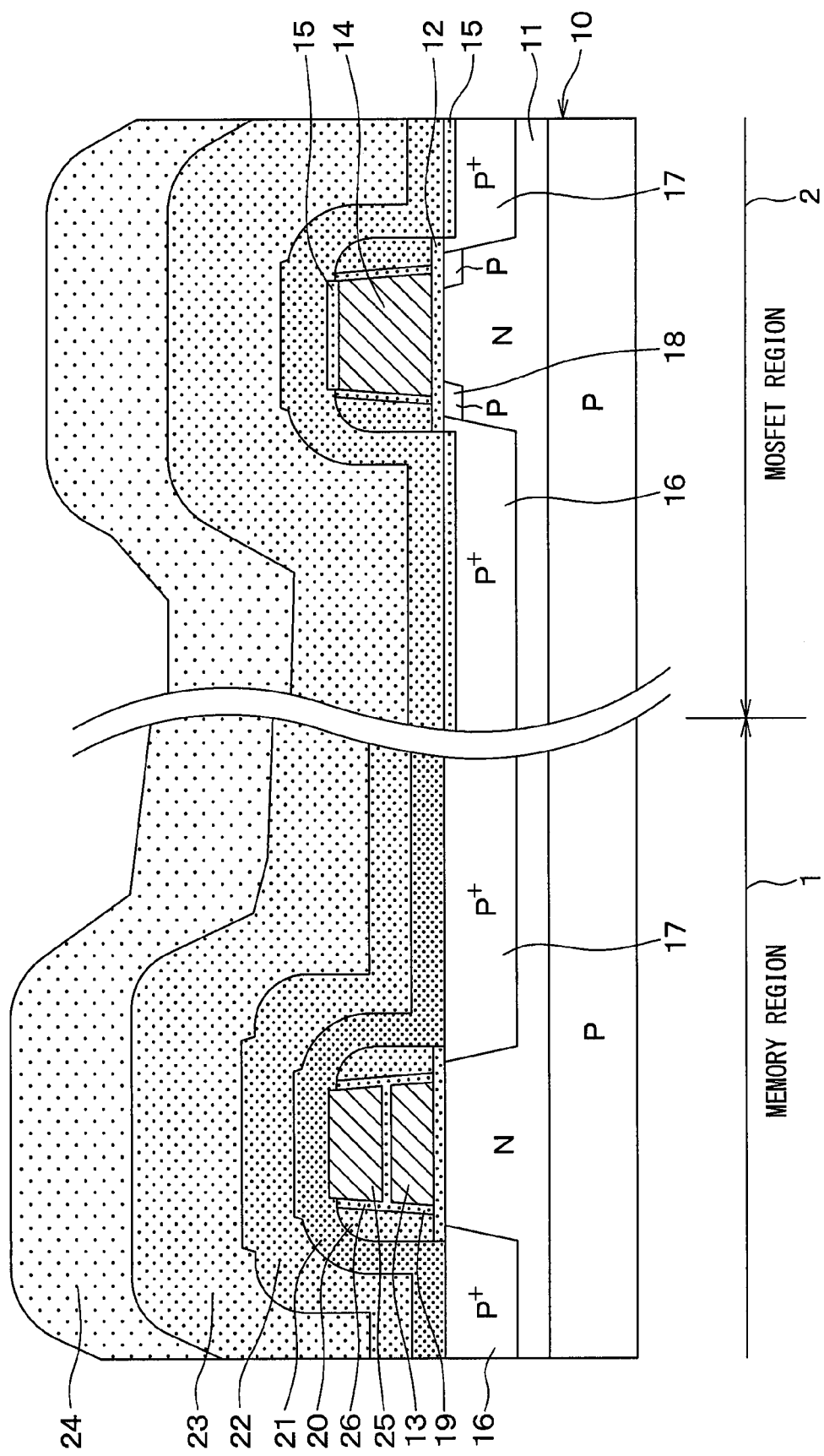
FIG. 9 is a cross-sectional view of a semiconductor device according to a second embodiment.

As shown in FIG. 9, a semiconductor device of the present embodiment includes a control gate 25 and an insulating film 26. The control gate 25 controls the amount of charges accumulated in a floating gate 13, and is disposed between the floating gate 13 and an oxide film 21 in a state of being electrically insulated from the floating gate 13. Specifically, according to the present embodiment, the insulating film 19 is also formed on an upper surface of the floating gate 13, and the control gate 25 is formed on an upper surface of an insulating film 19.

The insulating film 26 is formed on a side wall surface of the control gate 25, and sidewalls 20 are formed on the surface of the insulating films 19 and 26 opposite to the floating gate 13 and the control gate 25. The oxide film 21 is formed so as to cover the insulating film 12, the sidewalls 20, the control gate 25, and the insulating film 26.

The control gate 25 is formed by forming the insulating film 19 on the surface of the floating gate 13, then forming a polysilicon layer on surfaces of the insulating film 12 and the insulating film 19 by CVD, and removing a part of the polysilicon layer by etching using a mask (not shown). The insulating film 26 is formed by thermally oxidizing the surface of the control gate 25, and a portion of the insulating film 26 formed on an upper surface of the control gate 25 is removed by etching back when the sidewalls 20 are formed. In the present embodiment, after the control gate 25, the insulating films 19 and 26, and the sidewalls 20 have been formed, the oxide film 21 is formed.

As described above, in the present embodiment in which the control gate 25 is formed between the floating gate 13 and the oxide film 21, effects similar to the effects of the first embodiment can be obtained.

Other Embodiments

It should be noted that the present disclosure is not limited to the embodiments described above, and can be modified as appropriate. The embodiments described above are not independent of each other, and can be appropriately combined with each other except when the combination is obviously impossible. In each of the above embodiments, it is needless to say that the elements constituting the embodiment are not necessarily indispensable except when it is clearly indicated that they are particularly indispensable, when they are clearly considered to be indispensable in principle, and the like. Further, in each of the above embodiments, when numerical values such as the number, numerical value, quantity, range, and the like of the components of the embodiment are referred to, except in the case where the numerical value is expressly indispensable in particular, the case where the numerical value is obviously limited to a specific number in principle, and the like, the present disclosure is not limited to the specific number. Further, in each of the embodiments described above, when referring to the shape, positional relationship, and the like of the components and the like, the shape and relationship are not limited to the shape, positional relationship, and the like, except for the case where the shape and the positional relationship are specifically specified, the case where the shape and the positional relationship are fundamentally limited to a specific shape, positional relationship, and the like.

For example, in the first embodiment, the MOSFET element is formed to the substrate 10 as a semiconductor element different from the flash memory, but a semiconductor element other than the MOSFET element, for example, a bipolar transistor device may be formed to the substrate 10.

The film thickness t1 of the SiN film 22 and the film thickness t2 of the oxide film 23 may satisfy $t1 \le t2$ at least above the floating gate 13.

In the second embodiment, the floating gate 13 and the control gate 25 are formed between the insulating film 12 and the oxide film 21, but another conductor layer may be formed between the insulating film 12 and the oxide film 21.

In the second embodiment, the insulating film 19 as a thermal oxide film is formed between the floating gate 13 and the control gate 25, but an ONO film having a configuration in which a silicon nitride film is sandwiched between two thermal oxide films may be formed between the floating gate 13 and the control gate 25.

What is claimed is:

1. A semiconductor device comprising:
a substrate;
a memory region in which a flash memory that stores information by accumulating charges in a floating gate is formed,
an insulating film disposed between an upper surface of the substrate and the floating gate;
a first oxide film disposed directly on the floating gate;
a silicon nitride film disposed on an upper surface of the first oxide film; and
a second oxide film made of non-doped silicon oxide film and disposed on an upper surface of the silicon nitride film, wherein
at least above the floating gate, a film thickness of the second oxide film is equal to, or greater than, a film thickness of the silicon nitride film.

2. The semiconductor device according to claim 1, wherein
the film thickness of the second oxide film is 1.25 times or more of the film thickness of the silicon nitride film.

3. The semiconductor device according to claim 1, wherein
the silicon nitride film has a refractive index between 1.88 and 1.918 inclusive.

4. The semiconductor device according to claim 1, further comprising
an element region in which a semiconductor element different from the flash memory is formed to the substrate, wherein
the silicon nitride film is disposed in a region including the memory region and the element region.

5. A semiconductor device comprising:
a substrate;
a memory region in which a flash memory that stores information by accumulating charges in a floating gate is formed;
an insulating film disposed between an upper surface of the substrate and the floating gate;
a first oxide film disposed directly on the floating gate;
a silicon nitride film disposed on an upper surface of the first oxide film; and
a second oxide film made of non-doped silicon oxide film and disposed on an upper surface of the silicon nitride film, wherein
the silicon nitride film has a refractive index between 1.88 and 1.918 inclusive.

6. A manufacturing method of a semiconductor device including a memory region in which a flash memory that stores information by accumulating charges in a floating gate is formed, the manufacturing method comprising:
forming an insulating film on an upper surface of a substrate;
forming the floating gate on an upper surface of the insulating film;
forming a first oxide film directly on the floating gate;
forming a silicon nitride film on an upper surface of the first oxide film using $SiH_4$ gas and $N_2$ gas as raw materials; and
forming a second oxide film made of non-doped silicon oxide film on an upper surface of the silicon nitride film with a film thickness equal to, or greater than, a film thickness of the silicon nitride film.

7. The manufacturing method according to claim 6, wherein
the forming the second oxide film includes forming the second oxide film with a film thickness of 1.25 times or more of the film thickness of the silicon nitride film.

8. The manufacturing method according to claim 6, further comprising
forming a third oxide film on an upper surface of the second oxide at a film forming temperature of 300° C. or less.

9. The manufacturing method according to claim 6, wherein
the forming the silicon nitride film includes adjusting a gas ratio of the $SiH_4$ gas and the $N_2$ gas so that the silicon nitride film has a refractive index between 1.88 and 1.918 inclusive.

10. The manufacturing method according to claim 6, wherein
the forming the silicon nitride film includes performing plasma ignition after introducing the $SiH_4$ gas and the $N_2$ gas into an atmosphere to form the silicon nitride film by plasma CVD.

11. The manufacturing method according to claim 6, wherein
the forming the silicon nitride film includes setting an amount of the $SiH_4$ gas to be introduced into the atmosphere at a beginning of film formation between 115/4500 $cm^3$ and 125/4500 $cm^3$ inclusive with respect to 1 $cm^3$ of the $N_2$ gas.

12. The manufacturing method according to claim 6, further comprising
forming an element region in which a semiconductor element different from the flash memory is formed to the substrate, wherein
the forming the silicon nitride film includes forming the silicon nitride film in a region including the memory region and the element region.

13. A manufacturing method of a semiconductor device including a memory region in which a flash memory that stores information by accumulating charges in a floating gate is formed, the manufacturing method comprising:
forming an insulating film on an upper surface of a substrate;
forming the floating gate on an upper surface of the insulating film;
forming a first oxide film on an upper surface of the floating gate;
forming a silicon nitride film on an upper surface of the first oxide film using $SiH_4$ gas and $N_2$ gas as raw materials;
forming a second oxide film on an upper surface of the silicon nitride film; and
forming a third oxide film on an upper surface of the second oxide film at a film forming temperature of 300° C. or less.

14. The manufacturing method according to claim 13, wherein
the forming the silicon nitride film includes adjusting a gas ratio of the $SiH_4$ gas and the $N_2$ gas so that the silicon nitride film has a refractive index between 1.88 and 1.918 inclusive.

15. The manufacturing method according to claim 13, wherein
the forming the silicon nitride film includes performing plasma ignition after introducing the $SiH_4$ gas and the $N_2$ gas into an atmosphere to form the silicon nitride film by plasma CVD.

16. The manufacturing method according to claim 13, wherein the forming the silicon nitride film includes setting an amount of the SiH$_4$ gas to be introduced into the atmosphere at a beginning of film formation between 115/4500 cm$^3$ and 125/4500 cm$^3$ inclusive with respect to 1 cm$^3$ of the N$_2$ gas.

17. The manufacturing method according to claim 13, further comprising:
forming a control gate for controlling an amount of the charges accumulated in the floating gate in a state electrically insulated from the floating gate after forming the floating gate and before forming the silicon nitride film.

18. A manufacturing method of a semiconductor device including a memory region in which a flash memory that stores information by accumulating charges in a floating gate is formed, the manufacturing method comprising:
forming an insulating film on an upper surface of a substrate;
forming the floating gate on an upper surface of the insulating film;
forming a first oxide film directly on the floating gate;
forming a silicon nitride film on an upper surface of the first oxide film using SiH$_4$ gas and N$_2$ gas as raw materials; and
forming a second oxide film made of non-doped silicon oxide film on an upper surface of the silicon nitride film, wherein
the forming the silicon nitride film includes adjusting a gas ratio of the SiH$_4$ gas and the N$_2$ gas so that the silicon nitride film has a refractive index between 1.88 and 1.918 inclusive.

19. The manufacturing according to claim 18, wherein
the forming the silicon nitride film includes performing plasma ignition after introducing the SiH$_4$ gas and the N$_2$ gas into an atmosphere to form the silicon nitride film by plasma CVD.

20. The manufacturing method according to claim 18, wherein
the forming the silicon nitride film includes setting an amount of the SiH$_4$ gas to be introduced into the atmosphere at a beginning of film formation between 115/4500 cm$^3$ and 125/4500 cm$^3$ inclusive with respect to 1 cm$^3$ of the N$_2$ gas.

21. A manufacturing method of a semiconductor device including a memory region in which a flash memory that stores information by accumulating charges in a floating gate is formed, the manufacturing method comprising:
forming an insulating film on an upper surface of a substrate;
forming the floating gate on an upper surface of the insulating film;
forming a first oxide film directly on the floating gate;
forming a silicon nitride film on an upper surface of the first oxide film using SiH$_4$ gas and N$_2$ gas as raw materials; and
forming a second oxide film made of non-doped silicon oxide film on an upper surface of the silicon nitride film, wherein
the forming the silicon nitride film includes performing plasma igniting after introducing the SiH$_4$ gas and the N$_2$ gas into an atmosphere to form the silicon nitride film by plasma CVD.

22. The manufacturing method according to claim 21, wherein
the forming the silicon nitride film includes adjusting an amount of the SiH$_4$ gas to be introduced into the atmosphere at a beginning of film formation between 115/4500 cm$^3$ and 125/4500 cm$^3$ inclusive with respect to 1 cm$^3$ of the N$_2$ gas.

23. A manufacturing method of a semiconductor device including a memory region in which a flash memory that stores information by accumulating charges in a floating gate is formed, the manufacturing method comprising:
forming an insulating film on an upper surface of a substrate;
forming the floating gate on an upper surface of the insulating film;
forming an oxide film on an upper surface of the floating gate; and
forming a silicon nitride film on an upper surface of the oxide film using SiH$_4$ gas and N$_2$ gas as raw materials, wherein
forming the silicon oxide film includes setting an amount of the SiH$_4$ gas introduced into an atmosphere at a beginning of film formation between 115/4500 cm$^3$ and 125/4500 cm$^3$ inclusive with respect to 1 cm$^3$ of the N$_2$ gas.

* * * * *